US007899262B2

(12) United States Patent
Sugita

(10) Patent No.: US 7,899,262 B2
(45) Date of Patent: Mar. 1, 2011

(54) DATA COMPRESSION APPARATUS AND DATA COMPRESSING PROGRAM STORAGE MEDIUM

(75) Inventor: Yukio Sugita, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 916 days.

(21) Appl. No.: 11/819,384

(22) Filed: Jun. 27, 2007

(65) Prior Publication Data

US 2008/0010309 A1    Jan. 10, 2008

(30) Foreign Application Priority Data

Jul. 5, 2006   (JP) ................ 2006-185579

(51) Int. Cl.
G06K 9/36       (2006.01)
G06K 9/46       (2006.01)
(52) U.S. Cl. ........................................... 382/239
(58) Field of Classification Search .................. None
See application file for complete search history.

(56) References Cited

U.S. PATENT DOCUMENTS

| 6,539,119 | B1 * | 3/2003 | Kondo et al. | 382/232 |
|---|---|---|---|---|
| 6,657,567 | B2 * | 12/2003 | Koyanagi | 341/60 |
| 6,744,929 | B1 * | 6/2004 | Okada | 382/251 |
| 6,768,818 | B2 * | 7/2004 | Friederich et al. | 382/233 |
| 6,985,634 | B2 * | 1/2006 | Matsuura et al. | 382/248 |
| 7,183,950 | B2 * | 2/2007 | Sugita | 341/76 |
| 7,684,629 | B2 * | 3/2010 | Sugita | 382/239 |
| 7,702,163 | B2 * | 4/2010 | Saito et al. | 382/232 |
| 2005/0163387 | A1 * | 7/2005 | Sugita | 382/232 |
| 2006/0176196 | A1 * | 8/2006 | Sugita | 341/60 |
| 2006/0285756 | A1 * | 12/2006 | Sugita | 382/232 |
| 2007/0047827 | A1 * | 3/2007 | Sugita | 382/232 |
| 2007/0160287 | A1 * | 7/2007 | Sugita | 382/166 |
| 2009/0074401 | A1 * | 3/2009 | Sugita et al. | 396/548 |

FOREIGN PATENT DOCUMENTS

JP          5-328142 A       12/1993

* cited by examiner

*Primary Examiner* — Yuzhen Ge
(74) *Attorney, Agent, or Firm* — Sughrue Mion, PLLC

(57) ABSTRACT

A data compression apparatus includes: a type determination section which determines a type of data to be compressed; a difference generation section which obtains a difference between adjacent values in a sequence of values forming data to be compressed, and generates new data to be compressed; and an offset section which offsets each value forming the new data to be compressed by a predetermined value. The apparatus further includes a division section which divides values of the data to be compressed whose values are offset into a higher order bit portion and a lower order bit portion at a predetermined number of division bits lower than the number of unit bits, thereby dividing the data to be compressed into higher order data including a sequence of higher order bit portions of the values and lower order data including a sequence of lower order bit portions of the values.

15 Claims, 18 Drawing Sheets

| | | |
|---|---|---|
| 127 CONTINUOUS 00s → | 00 7F | (HEX) 2 BYTES |
| 32767 CONTINUOUS 00s → | 00 FF 7F | (HEX) 3 BYTES |
| 32895 (32767+128) CONTINUOUS 00s → | 00 FF FF | (HEX) 3 BYTES |
| 128 CONTINUOUS 00s → | 00 80 00 | (HEX) 3 BYTES |
| 129 CONTINUOUS 01s → | 01 80 01 | (HEX) 3 BYTES |
| 4096 CONTINUOUS FFs → | FF 8F 80 | (HEX) 3 BYTES |

Fig. 14

| BEFORE CODING | AFTER CODING |
|---|---|
| A1 | 00 |
| A2 | 01 |
| A3 | 100 |
| A4 | 101 |
| A5 | 11000 |
| A6 | 11001 |
| A7 | 11101 |
| A8 | 11011 |
| A9 | 111000 |
| A10 | 111001 |
| A11 | 111010 |
| A12 | 111011 |
| A13 | 111100 |
| A14 | 111101 |
| A15 | 111110 |
| A16 | 111111 |

DATA COMPRESSION APPARATUS AND DATA COMPRESSING PROGRAM STORAGE MEDIUM

BACKGROUND OF THE INVENTION

1. Field of the Invention

The present invention relates to a data compression apparatus which compresses data such as image data, etc. and a storage medium a data compressing program causing an information processing apparatus such as a computer, etc. to operate as the data compression apparatus.

2. Description of the Related Art

Conventionally, a technique of compressing data such as image data, etc. has been widely used to reduce stored data, amount of communicated data, etc.

For example, Japanese Patent Laid-Open No. 5-328142 discloses a technique of assigning a color number such that sequential color numbers can have color data with close values when a representing color is selected from an original image and a CLUT (color lookup table) is generated, generating a bit map corresponding to the CLUT, obtaining a difference in color number between adjacent pixels, changing the color number of the bit map in the range in which no degradation occurs in image quality when the difference indicates a large value, biasing the difference to a small value, and performing a run length coding process on difference data.

Introduced below is a system to which a data compressing technique is applied.

FIG. 1 shows an example of a printing system to which a data compressing technique is applied. FIG. 2 shows a flow of a data process in the printing system.

As shown in FIG. 1, the printing system includes a host controller 100, interface equipment 200, and a printer 300. The host controller 100 is connected to the interface equipment 200 through a general-purpose interface cable 150 such as an SCSI, etc., and the interface equipment 200 is connected to the printer 300 through a dedicated interface cable 250.

In the host controller 100, as shown in FIG. 2, data 11 of a character and an image described in various languages and formats such as the PDF, the PS, the TIFF, etc. is divided into image (continuous tone (CT)) data and data of line etc. (line work (LW)), bit map data 12A and 13A are generated by performing RIP (raster image processing) on each piece of data, and a data compressing process is performed on each piece of data, thereby generating compressed data 14 on the CT and compressed data 15 on the LW. The compressed data 14 and 15 are transferred from the host controller 100 to the interface equipment 200 through the general-purpose interface cable 150 as shown in FIG. 1. In the interface equipment 200, a data decompressing process is performed on the transferred compressed data 14 and 15, and bit map data 12B and 13B corresponding to the bit map data 12A and 13A in the state before the data compressing process is performed by the host controller 100 are generated.

The interface equipment 200 combines the decompressed CT data (bit map data 12B) and LW data (bit map data 13B), dot information etc. are added as a tag, and the result is transmitted to the printer 300. The printer 300 outputs an image on the basis of the bit map data received from the interface equipment 200 and tag information added to the data.

When it is necessary to have the host controller 100 and the interface equipment 200 as independent devices such as the case where the host controller 100 is, for example, separated from the interface equipment 200, or where the interface equipment 200 receives image data from plural host controllers, then the host controller 100 performs data compression as shown in FIG. 2 and transfers the data to the interface equipment 200, and the interface equipment decompresses the data, thereby shortening the data transfer time from the host controller 100 to the interface equipment 200 and improving the productivity of printing.

Generally, a compressing system such as the JPEG, etc. which is a non-reversible system and has a high compression rate is used for the CT data while a reversible compressing system such as PackBits etc. is used for on the LW data.

However, in the compressing system such as the JPEG, etc., a long time is required to perform the compressing process using software, thereby causing the throughput of the entire system to be degraded.

Although the JPEG, etc. inevitably has the problem of degradation of image quality because it is a non-reversible compressing process, there has been increasing demand for higher image quality. And also, reversible compression for the CT data without degradation of image quality has been studied.

SUMMARY OF THE INVENTION

The present invention has been made in view of the above-circumstances, and provides a data compression apparatus and a data compressing program storage medium capable of performing a new, preferable, and reversible compressing process also applicable to the CT data.

The data compression apparatus according to the present invention is a data compression apparatus which performs a data compressing process on data to be compressed including a sequence of values represented by a predetermined number of unit bits, and includes:

a type determination section which determines a type of the data to be compressed;

a difference generation section which obtains a difference between adjacent values in the sequence of the values forming the data to be compressed, and generates new data to be compressed including a sequence of values representing the difference;

an offset section which offsets each of the values forming the new data to be compressed by a predetermined value;

a division section which divides the values of the data to be compressed whose values are offset by the offset section into a higher order bit portion and a lower order bit portion at a predetermined number of division bits lower than the number of unit bits, thereby dividing the data to be compressed into higher order data including a sequence of higher order bit portions of the values and lower order data including a sequence of lower order bit portions of the values;

a lower order data compression section which performs a reversible compressing process on a basis of the type determined by the type determination section on the lower order data obtained through the division by the division section; and a higher order data compression section which performs a reversible compressing process on the higher order data obtained through the division by the division section.

In the description above, "adjacent" in "obtains a difference between adjacent values in the sequence of the values forming the data to be compressed" can refer to be adjacent on a data stream, but is not limited to this. For example, if two-dimensional image data is processed as one-dimensional streaming data, the data can be adjacent on two-dimensional images. Furthermore, the "difference between adjacent values" refers to including not only a one-dimensional difference but also a multidimensional difference, that is, two or more dimensional difference. The same holds true with the following descriptions.

It is preferable that, in the data compression apparatus according to the present invention, the type determination section determine the type of the data to be compressed on a basis of the lower order data obtained through the division by the division section.

It is preferable that, in the data compression apparatus according to the present invention, the data to be compressed be data which represents one of a continuous tone image and a line-work image, and the type determination section determine whether the data is of a first type representing the continuous tone image or of a second type representing the line-work image. In this case, it is preferable that the type determination section determine the type of the data to be compressed on the basis of a histogram of the values occurring in the data, and the type determination section determine the type of the data to be compressed on a basis of the new data to be compressed generated by the difference generation section.

Furthermore, if the data to be compressed is data which represents one of a continuous tone image and a line-work image, and the type determination section determines whether the data is of a first type representing the continuous tone image or of a second type representing the line-work image, it is preferable to include a type coding section which outputs values excluding one or more predetermined compression object values as they are in the lower order data and outputs a coded value representing the compression object value and a coded value representing a number of repetitions of the compression object value when the type determination section determines that the type of the data to be compressed is the second type, and outputs all values in the lower order data as they are when the type determination section determines that the type of the data to be compressed is the first type. In the apparatus with this preferable feature, it is more preferable to include an entropy coding section which performs an entropy coding process using a table for correspondence between a code and a value on data including the values output by the type coding section, and it is specifically preferable to include a Huffman coding section which performs a Huffman coding process using a Huffman table on data including the values output by the type coding section. When the entropy coding section and the Huffman coding section are thus included in the apparatus, the entropy coding section and the Huffman coding section receive an instruction to omit compression and output the data including the values output by the type coding section without compression.

It is also preferable that, in the data compression apparatus according to the present invention, the higher order data compression section include a first coding section which outputs values excluding one or more predetermined compression object values as they are in the higher order data and outputs a coded value representing the compression object value and a coded value representing a number of repetitions of the compression object value. It is also preferable that the higher order data compression section include a second coding section which performs an entropy coding process on the data coded by the first coding section using a table for correspondence between a code and a value. In this case, it is preferable that the second coding section perform a Huffman coding process on the data coded by the first coding section using a Huffman table.

It is also preferable that, in the data compression apparatus according to the present invention, the higher order data compression section include: a first coding section which outputs values excluding one or more predetermined compression object values as they are in the higher order data and outputs a coded value representing the compression object value and a coded value representing a number of repetitions of the compression object value; a histogram calculation section which obtains a histogram of the values occurring in the data coded by the first coding section; a code assignment section which assigns a code having a shorter length to a value with a higher frequency of occurrence in a table for correspondence between a code and a value on a basis of the histogram obtained by the histogram calculation section; and a second coding section which performs an entropy coding process on the data coded by the first coding section using the table in which the code is assigned by the code assignment section.

A data compressing program storage medium of the present invention is a storage medium that stores a data compressing program which is incorporated into and causes an information processing apparatus to perform a data compressing process on data to be compressed and including a sequence of values represented by a predetermined number of unit bits, and implements in the information processing apparatus:

a type determination section which determines a type of the data to be compressed;

a difference generation section which obtains a difference between adjacent values in the sequence of the values forming the data to be compressed, and generates new data to be compressed including a sequence of values representing the difference;

an offset section which offsets each of the values forming the new data to be compressed by a predetermined value;

a division section which divides the values of the data to be compressed whose values are offset by the offset section into a higher order bit portion and a lower order bit portion at a predetermined number of division bits lower than the number of unit bits, thereby dividing the data to be compressed into higher order data including a sequence of higher order bit portions of the values and lower order data including a sequence of lower order bit portions of the values;

a lower order data compression section which performs a reversible compressing process on a basis of the type determined by the type determination section on the lower order data obtained through the division by the division section; and a higher order data compression section which performs a reversible compressing process on the higher order data obtained through the division by the division section.

Only the basic feature of the data compressing program storage medium according to the present invention has been described above to avoid duplicate descriptions. However, the data compressing program storage medium according to the present invention includes not only the basic feature, but also various additional features corresponding to the above-described additional features of the above-mentioned data compression apparatus.

A component such as the offset section that the data compressing program according to the present invention implements in a computer can be configured with one program module or plural program modules. Alternatively, plural components may be configured by one program module. These components can be configured such that the operations can be performed by the components themselves, or by giving an instruction to a program or a program module incorporated into a computer.

According to the data compression apparatus and the data compressing program storage medium of the present invention, the value of the new data to be compressed and generated by the difference generation section is offset by the offset section and divided into higher order data and lower order data, a reversible compressing process is performed on the higher order data, and a reversible compressing process is performed on the lower order data depending on the type of the data to be compressed which is determined by the type determination section.

Since the characteristic of the type of the data to be compressed is clearly represented in the lower order data after dividing the data, the type determination section determines the type of the data to be compressed on the basis of the lower order data including a less amount of data than the original data, thereby improving the determination efficiency.

There is a stronger tendency in the LW data that the values of data are concentrated on some specific values than in the CT data. Therefore, for the LW data, a high compression rate can be attained by providing the type coding section which codes only such a specific value and a value representing the number of repetitions of the specific value. At this time, the method of determining whether the data to be compressed is the LW data or the CT data can be a method of determining it by the degree of the concentration of the values in the data on a specific value on the basis of the histogram of the values occurring in the data, or a method of determining it by the concentration rate of the values occurring in the new data to be compressed as the data after obtaining a difference. In these methods, it can be easily determined whether the data to be compressed is the LW data or the CT data.

If the lower order data compression section is provided with the entropy coding section, further improvement in compression rate can be expected by an entropy coding process. Especially, if the lower order data compression section is provided with the Huffman coding section as a typical example of the entropy coding process, a high compression rate can be realized by a Huffman coding process. At this time, if the entropy coding section and the Huffman coding section output the lower order data without compression in response to an instruction to omit compression, then a high-speed compressing process can be selected by the instruction.

When the higher order data compression section is provided with the first coding section, only the compression object value is coded as the compression object value itself and the value representing the number of repetitions, thereby avoiding the problem that the resultant data is more redundant than the original data, and improving the compression rate.

Additionally, when the higher order data compression section is provided with the second coding section, it is expected that the compression rate can be further improved by the entropy coding process (typically by the Huffman coding process).

Furthermore, if the higher order data compression section is provided with a histogram calculation section and a code assignment section, and the second coding section performs the entropy coding process (for example, the Huffman coding process) using a table assigned a code by the code assignment section, then the compression rate can be improved much more than the entropy coding process performed using the table for which the assignment of a code is fixed.

BRIEF DESCRIPTION OF THE DRAWINGS

FIG. 14 shows an example of the coding process depending on the number of repetitions by the run length coding section shown in FIG. 3;

FIG. 16 shows an example of a Huffman table;

FIG. 17 shows a practical example of a sequence of codes prepared on a Huffman table.

DETAILED DESCRIPTION OF THE INVENTION

Described below is an image compression apparatus according to an embodiment of the present invention, which is incorporated into a host controller in the entire system shown in FIG. 1. Practically, it relates to a process of performing a data compressing process on the bit map data 12A of the CT data and the bit map data 13A of the LW data in the host controller shown in FIG. 2. Therefore, in this example, it is considered that the data compressing process on the CT data and the LW data described above by referring to FIGS. 1 and 2 is replaced with the data compressing process according to an embodiment of the present invention as will be described below, and the data decompressing process in the interface equipment is replaced with the data decompressing process corresponding to the data compressing process according to the embodiment of the present invention. Accordingly, duplicate drawings and descriptions of the entire system and description of the flow of the process, which are already provided above for those shown in FIGS. 1 and 2, will be omitted.

Figure 3:
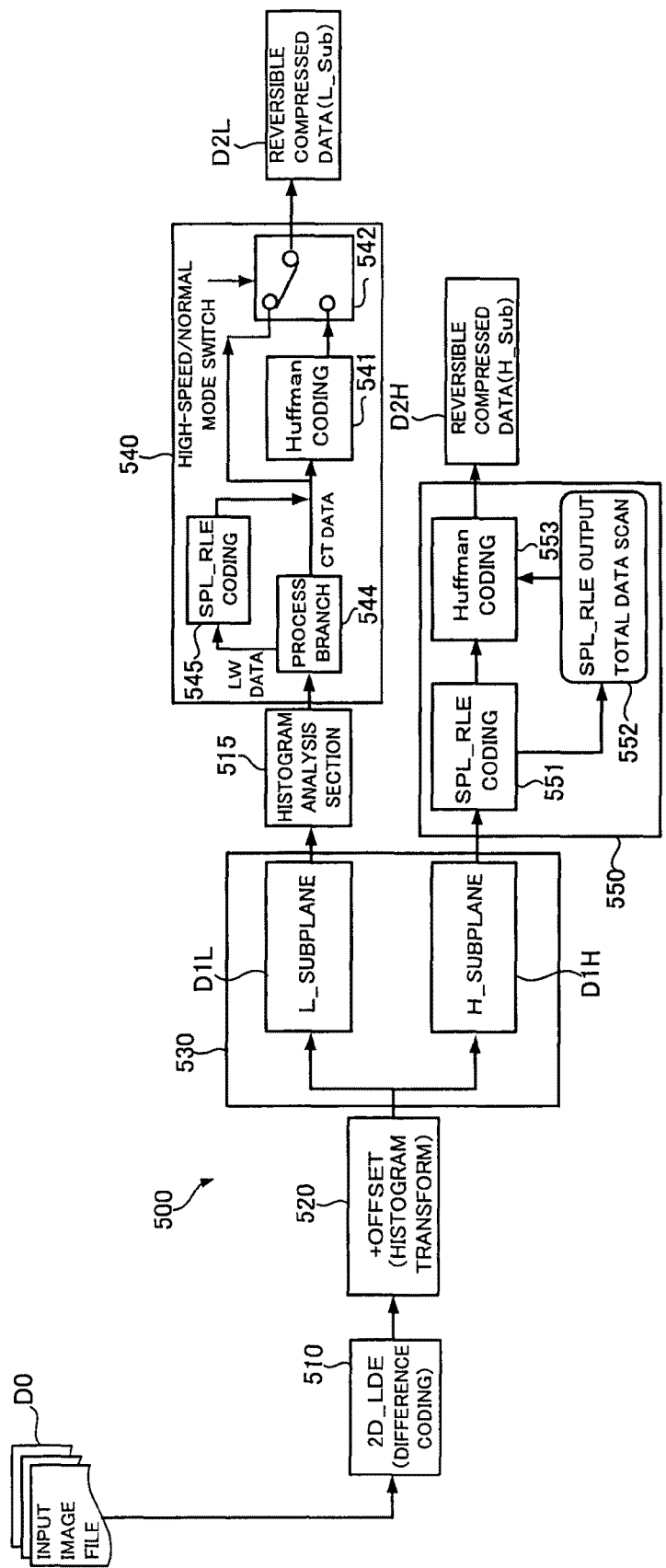
FIG. 3 is a block diagram showing an image compression apparatus according to an embodiment of the data compression apparatus of the present invention.

FIG. 3 is a block diagram of the configuration of the image compression apparatus corresponding to an embodiment of the data compression apparatus according to the present invention.

An image compression apparatus 500 shown in FIG. 3 is an image compression apparatus which performs a reversible compressing process on both CT data and LW data. To perform the reversible compressing process, it includes a difference coding section 510, a histogram analysis section 515, an offset section 520, a plane division section 530, an L plane compression section 540, and an H plane compression section 550. The details of each of the sections 510 to 550 will be described later, and the flow of the image data in the image compression apparatus 500 will be described below.

Figure 2:
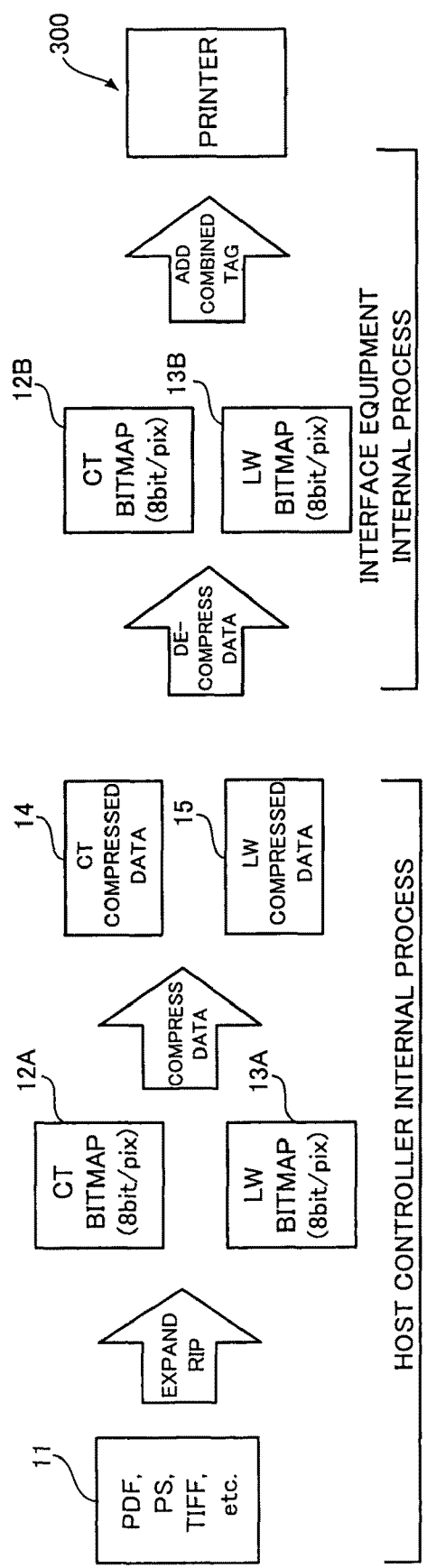
FIG. 2 shows a flow of the data processing by the print system.

An input image file D0 (the file storing the CT data 12A and the LW data 13A that are exploded in bitmap in the present embodiment of the present invention, as shown in FIG. 2) is input to the difference coding section 510, and a two-dimensional difference coding process is performed. That is, a two-dimensional difference is obtained on a sequence of values forming the input data on the basis of values adjacent in respective directions when viewed on the image, thereby generating image data formed by a sequence of 8-bit values representing the difference. The difference coding section 510 corresponds to an example of the difference generation section according to the present invention.

The image data formed by the sequence of values representing the difference generated by the difference coding section 510 is input to the offset section 520 and offset by a predetermined amount. The plane division section 530 divides the 8-bit values in the offset image data into lower order bits and higher order bits. Thus, the image data is divided into a lower order subplane D1L formed by a sequence of lower order bit values and a higher order subplane D1H formed by a sequence of higher order bit values. The offset section 520 corresponds to an example of the offset section according to the present invention, and the plane division section 530 corresponds to an example of the division section according to the present invention. The lower order subplane D1L and the higher order subplane D1H correspond to examples of the lower order data and the higher order data according to the present invention respectively.

The L plane compression section 540 and the H plane compression section 550 perform the reversible compressing process respectively on the lower order subplane D1L and the higher order subplane D1H divided by the plane division section 530. On the lower order subplane D1L, the histogram analysis section 515 performs a histogram analysis process before input to the L plane compression section 540, and it is determined whether the data in the input image file D0 is CT data or LW data. The L plane compression section 540 performs the reversible compressing process depending on the determination result of the histogram analysis section 515. The L plane compression section 540 and the H plane compression section 550 correspond to examples of the lower order data compression section and the higher order data compression section according to the present invention, respectively, and the histogram analysis section 515 corresponds to an example of the type determination section according to the present invention.

The L plane compression section 540 is provided with a process branch section 544. If the histogram analysis section 515 determines that the data in the input image file D0 is the CT data, then the process branch section 544 outputs the input lower order subplane D1L to a Huffman coding section 541. If the histogram analysis section 515 determines that the data in the input image file D0 is the LW data, then the process branch section 544 outputs the input lower order subplane D1L to a run length coding section 545. The run length coding section 545 detects the presence of one or more compression object values and the number of repetitions of the same compression object values from among the data of the input lower order subplane D1L. Then, upon receipt of the result of the detection, the run length coding section 545 performs a coding process of outputting as it is the value excluding the compression object value in the data of the lower order subplane D1L, and outputting a code of the compression object value itself and a code of a value representing the number of repetitions of the compression object values. In the coding process, the run length coding section 545 represents the number of repetitions by different numbers of bits on the basis of the number of repetitions of the same compression object values. In this example, if the number of repetitions of the same compression object values is practically a predetermined number or less, it is represented by the number of one unit bit. If the number of repetitions exceeds the predetermined value, it is represented by the number of two unit bits. In the embodiment of the present invention, a combination of the run length coding section 545 and the process branch section 544 corresponds to an example of the type coding section according to the present invention. The data coded by the run length coding section 545 is input to the Huffman coding section 541. That is, by the operation of the process branch section 544, the run length coding process is performed on the lower order subplane D1L of the LW data, and then the data is input to the Huffman coding section 541, and the lower order subplane D1L of the CT data is input as it is to the Huffman coding section 541.

According to Huffman table for correspondence between a value and a code, the Huffman coding section 541 of the L plane compression section 540 performs the coding process of replacing the value forming the lower order subplane D1L input to the Huffman coding section 541 with the code on the basis of the Huffman table. The Huffman coding process is a type of entropy coding process. The Huffman coding section 541 corresponds to an example of the entropy coding process according to the present invention, and also corresponds to an example of the Huffman coding section according to the present invention. A mode switch section 542 is incorporated into the L plane compression section 540. At an instruction from a user to switch between the high-speed mode and the normal mode, the mode switch section 542 switches between the normal mode through the Huffman coding process by the Huffman coding section 541 and the high-speed mode in which the Huffman coding process is omitted and the lower order subplane D1L is output as it is. Therefore, finally, in the normal mode, the lower order compressed data D2L obtained by compressing the lower order subplane D1L by the Huffman coding process is output from the L plane compression section 540. In the high speed mode, the lower order compressed data D2L on which the Huffman coding process is not performed is output.

On the other hand, the H plane compression section 550 is provided with a run length coding section 551, a data scanning section 552, and a Huffman coding section 553. The higher order subplane D1H is input to the run length coding section 551 in the H plane compression section 550.

The run length coding section 551 in the H plane compression section 550 performs the run length coding process similarly to that performed by the run length coding section 545 in the L plane compression section 540 on the input higher order subplane D1H. In the embodiment of the present invention, the run length coding section 551 in the H plane compression section 550 corresponds to an example of the first coding section according to the present invention. The data coded by the run length coding section 551 in the H plane compression section 550 is then input to both the data scanning section 552 and the Huffman coding section 553. The data scanning section 552 scans all data after coding by the run length coding section 551, and the frequency of occurrence (histogram) of all values occurring in the data is obtained. The process of obtaining the frequency of occurrence is performed on each higher order subplane D1H shown in FIG. 3 as a unit in the embodiment of the present invention, and the frequency of occurrence of the value in the data coded by the run length coding section 551 in each higher order subplane D1H is obtained. Furthermore, the data scanning section 552 assigns a code having a shorter code length to a value having a higher frequency of occurrence on the Huffman table on the basis of the obtained data histogram (frequency of occurrence of a value). The data scanning section 552 corresponds to an example of the histogram calculation section and the code assignment section according to the present invention.

The Huffman table whose value is assigned a code by the data scanning section 552 is passed to the Huffman coding section 553. The Huffman coding section 553 performs a coding process of replacing the value forming the data input to the Huffman coding section 553 according to the passed Huffman table with a code on the basis of the Huffman table, that is, a code represented by a shorter bit length for a value having a higher frequency of occurrence. The Huffman coding section 553 corresponds to an example of the second coding section according to the present invention.

The data on which the Huffman coding process is performed by the Huffman coding section 553 is provided with the compression information including the assignment table of values and codes assigned by the data scanning section 552, and output as higher order compressed data D2H obtained by compressing the higher order subplane D1H from the H plane compression section 550.

Thus, a set of the lower order compressed data D2L and higher order compressed data D2H output respectively from the L plane compression section 540 and H plane compression section 550 form the compressed data for the original image data. The compressed data is transferred to the interface equipment 200 through the general-purpose interface cable 150 such as the SCSI, etc. shown in FIG. 1. The interface equipment 200 performs the data decompressing process on the received reversible compressed data. In the data decompressing process, the decoding process corresponding to the above-described various coding processes shown in FIG. 3 is performed, and the same image data as in the original input image file is reconstructed.

Figure 1:
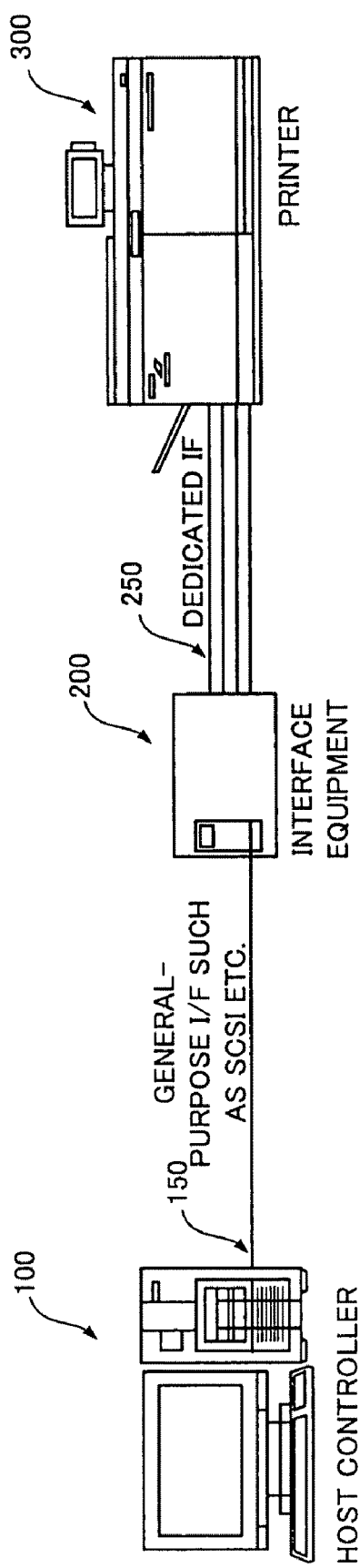
FIG. 1 shows an example of a print system to which a data compressing technique is applied.
Figure 4:
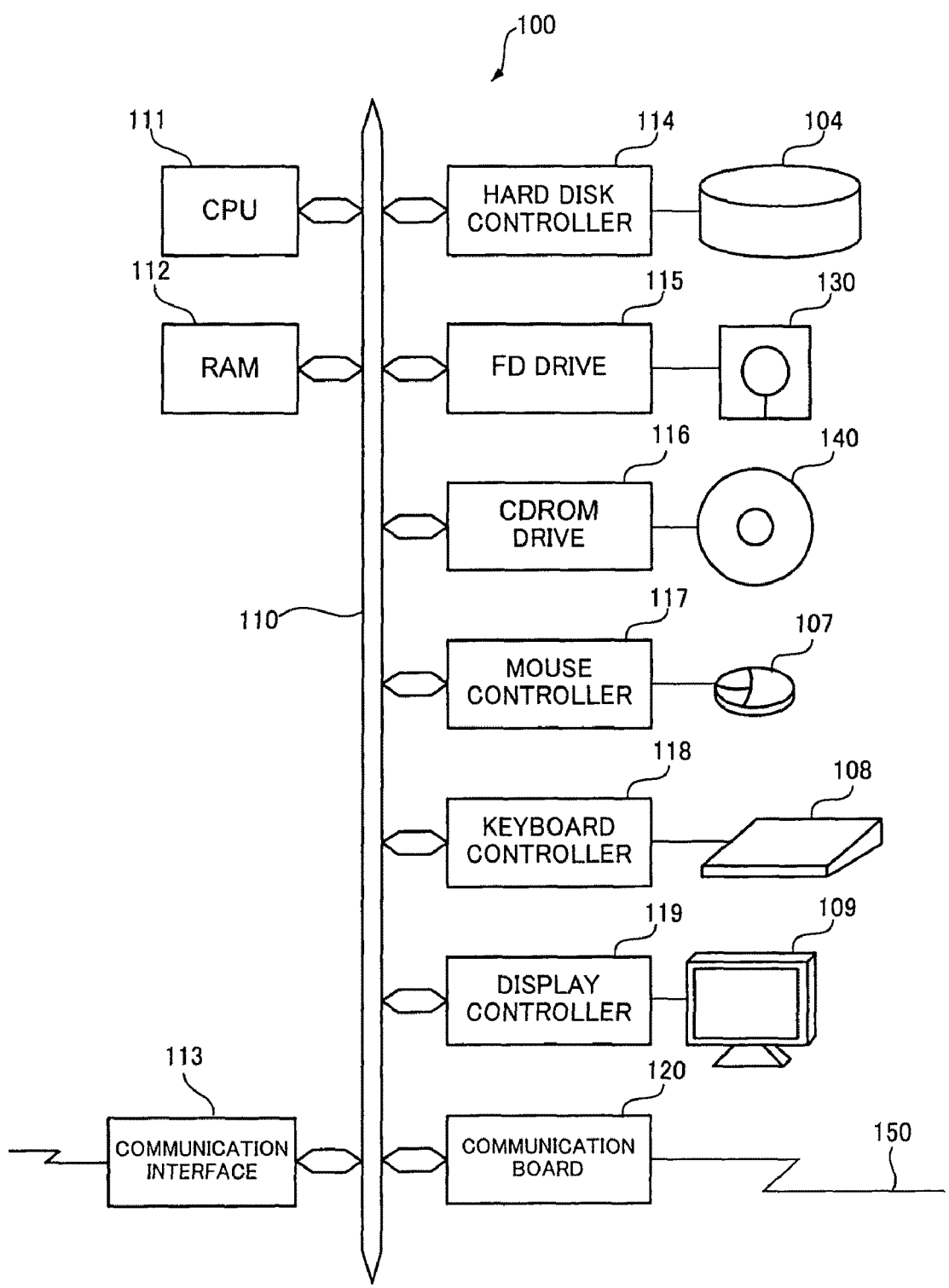
FIG. 4 shows the configuration of the hardware of a host controller shown in FIG. 1.

FIG. 4 shows the configuration of the hardware of the host controller 100 shown in FIG. 1.

The host controller 100 shown in FIG. 1 is configured by the computer system having the configuration shown in FIG. 4.

The host controller 100 configured by the computer system as shown in FIG. 4 is provided with a CPU 111, RAM 112, a communication interface 113, a hard disk controller 114, an FD drive 115, a CDROM drive 116, a mouse controller 117, a keyboard controller 118, a display controller 119, and a communication board 120. These components are connected via a bus 110.

The hard disk controller 114 controls the access to a hard disk 104 built in the host controller 100. The FD drive 115 and the CDROM drive 116 control access to flexible disk (FD) 130 and CDROM 140 removably loaded on the host controller 100. The mouse controller 117 and the keyboard controller 118 detect the operations of a mouse 107 and a keyboard 108 provided for the host controller 100, and transmit the information to the CPU 111. At an instruction of the CPU 111, the display controller 119 displays an image on the display screen of an image display 109 provided for the host controller 100.

The communication board 120 performs communications in accordance with the general-purpose interface protocol such as the SCSI, etc., and transfers compressed image data to the interface equipment 200 (FIG. 1) through the interface cable 150.

Furthermore, the communication interface 113 performs general-purpose communications such as the Internet, and the host controller 100 can fetch image data through the communication interface 113.

A program stored in the hard disk 104 is read to the RAM 112, and expanded for execution by the CPU 111. The program expanded on the RAM 112 is read and executed by the CPU 111.

Figure 5:
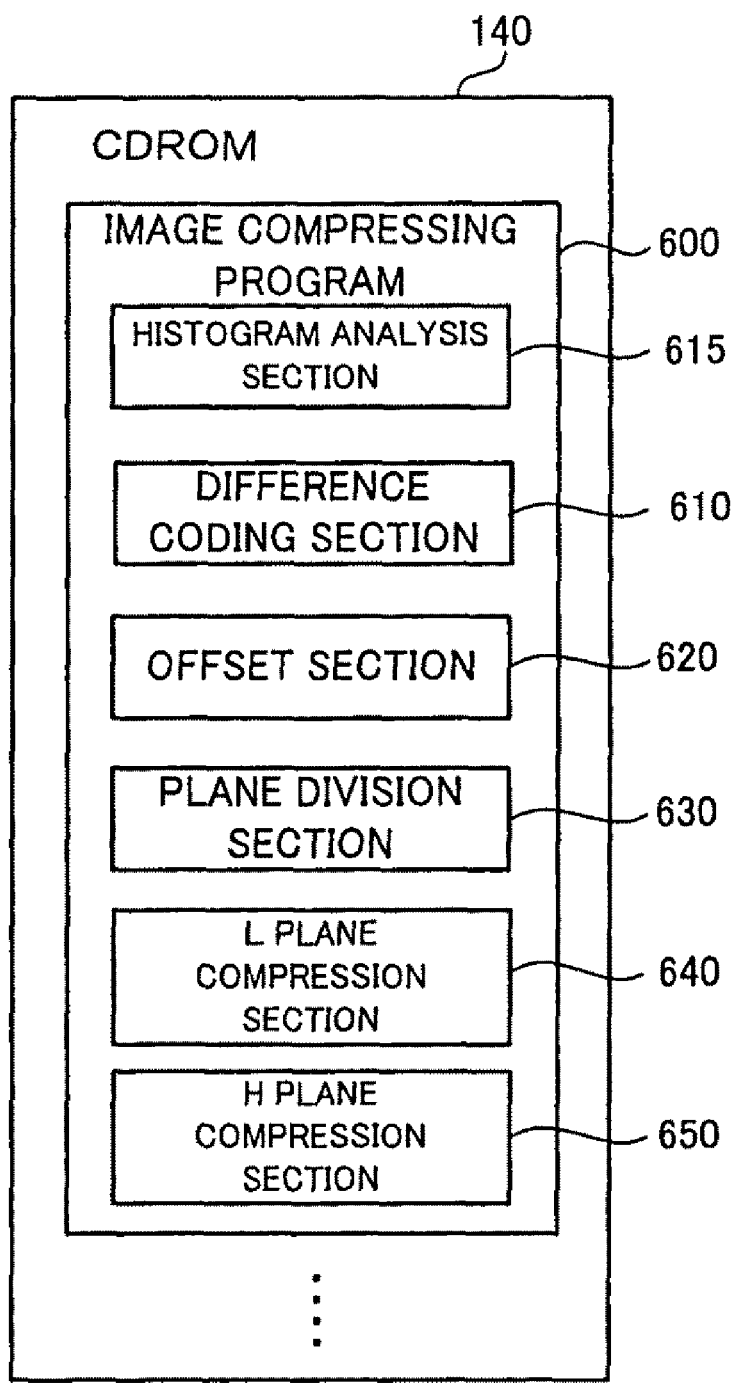
FIG. 5 shows the schematic chart of an image compressing process program stored in a storage medium according to an embodiment of the data compressing program storage medium of the present invention.

FIG. 5 is a schematic chart of an image compressing program stored in a storage medium according to an embodiment of the data compressing program storage medium of the present invention.

In this example, an image compressing program 600 is stored in the CDROM 140.

The image compressing program 600 is configured by a difference coding section 610, a histogram analysis section 615, an offset section 620, a plane division section 630, an L plane compression section 640, and an H plane compression section 650. The CDROM 140 stores various programs for performing a series of processes in the host controller 100 shown in FIG. 1 in addition to the image compressing program 600. However, since such programs are similar to those in the conventional techniques, the drawings and the descriptions are omitted here.

The CDROM 140 shown in FIG. 5 is loaded into the host controller 100 shown in FIG. 4 and accessed by the CDROM drive 116, and the program stored in the CDROM 140 is uploaded into the host controller 100 and stored in the hard disk 104. When the program stored on the hard disk 104 is read from the hard disk 104, expanded on the RAM 112, and executed by the CPU 111, the host controller 100 functions as a device serving as a host controller which performs various processes including the process of the image compression apparatus 500 shown in FIG. 3.

The image compressing program 600 shown in FIG. 5 is installed on the host controller 100 and executed by the CPU 111, thereby realizing the image compression apparatus 500 shown in FIG. 3 in the host controller 100. The difference coding section 610, the histogram analysis section 615, the offset section 620, the plane division section 630, the L plane compression section 640, and the H plane compression section 650 are program modules for causing the components of the host controller 100 to operate as the difference coding section 510, the histogram analysis section 515, the offset section 520, the plane division section 530, the L plane compression section 540, and the H plane compression section 550 configuring the image compression apparatus 500 shown in FIG. 3, when executed by the CPU 111. That is, these program modules can practically structure the components of the image compression apparatus 500 on the host controller 100.

The operations of the sections 610 to 650 configuring the image compressing program 600 shown in FIG. 5 when it is executed by the CPU 111 are the operations of the sections 510 to 550 configuring the image compression apparatus 500 shown in FIG. 3. Therefore, the descriptions of the sections 510 to 550 of the image compression apparatus 500 shown in FIG. 3 provided so far and will be provided below will be also applied to the sections 610 to 650 configuring the image compressing program 600 shown in FIG. 5.

Figure 6:
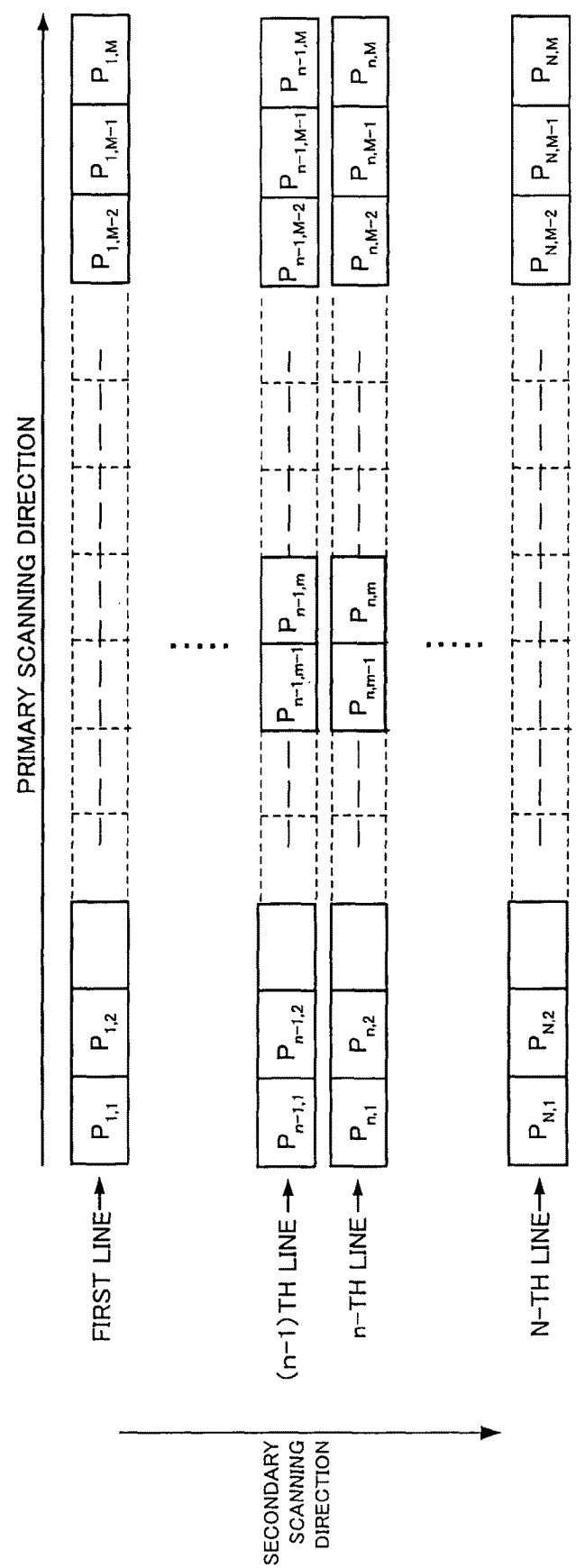
FIG. 6 shows the structure of image data in an input image file input to the data compression apparatus shown in FIG. 3.
Figure 7:
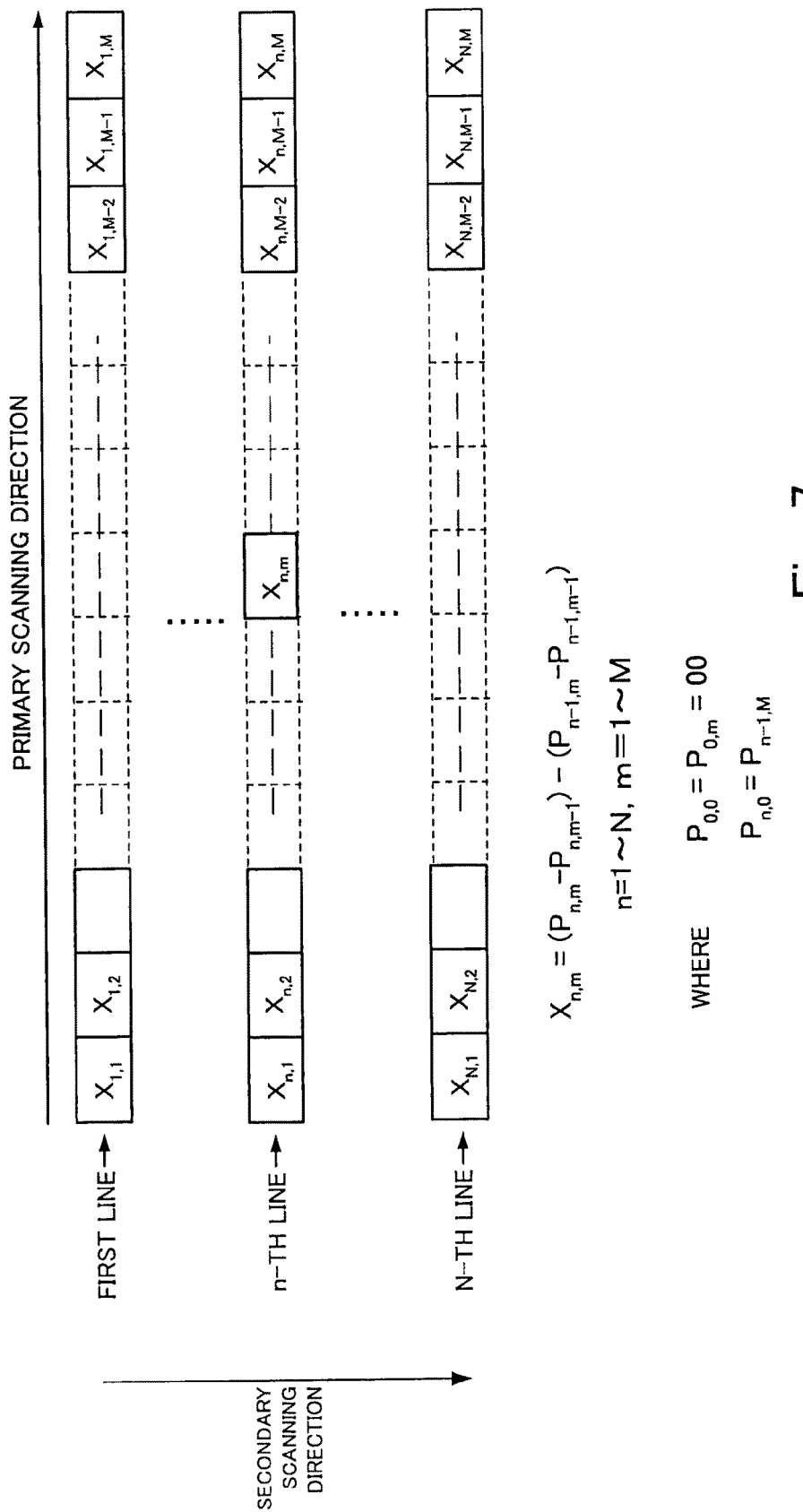
FIG. 7 shows the structure of data after a two-dimensional difference coding process is performed on the image data in the input image file input to the image compression apparatus shown in FIG. 3.

FIG. 6 shows the structure of the image data in the input image file input to the image compression apparatus 500 shown in FIG. 3. FIG. 7 shows the structure of the data after the two-dimensional difference coding process is performed on the data.

The image represented by the image data in the input image file is configured by N lines, each of which includes M pixels in a predetermined primary scanning direction, in a secondary scanning direction perpendicular to the primary scanning direction. With the configuration, the image data also has the structure of N lines, each of which includes M pixel values in the primary scanning direction (horizontal direction in FIG. 6), in the secondary scanning direction (vertical direction shown in FIG. 6), as shown in FIG. 6. In FIG. 6, the pixel value of the m-th pixel in the n-th line is expressed by $P_{n,m}$. In this expression, in the n-th line in the secondary scanning direction, the pixel value of each pixel in the primary scanning direction is expressed by $P_{n,1}$, $P_{n,2}$, . . . , $P_{n,m-1}$, $P_{n,m}$, . . . , $P_{n,M-2}$, $P_{n,M-1}$, $P_{n,M}$. These pixel values are expressed in hexadecimal.

The above-mentioned image data is input to the difference coding section 510 configuring the image compression apparatus 500 shown in FIG. 3, the two-dimensional difference coding process is performed on the data, thereby further obtaining a difference in the secondary scanning direction in difference between the pixels adjacent in the primary scanning direction.

FIG. 7 shows the structure of the data on which the two-dimensional difference coding process is performed. The data also has the configuration in which M-pixel lines in the primary scanning direction on which the two-dimensional difference coding process is performed are arranged in N lines in the secondary scanning direction. In FIG. 7, the pixel value of the m-th pixel in the n-th line on which two-dimensional difference coding process is performed is expressed by $X_{n,m}$, and the value of the pixel $X_{n,m}$ after the two-dimensional difference coding process is obtained by the following transform equation from the four pixels $\{P_{n-1,m-1}, P_{n-1,m}, P_{n,m-1}, P_{n,m}\}$ before the two-dimensional difference coding process as shown at the central portion of FIG. 6.

$$X_{n,m} = (P_{n,m} - P_{n,m-1}) - (P_{n-1,m} - P_{n-1,m-1}) \quad (1)$$

When n=1 or m=1, the subscript of 0 occurs on the pixel value before the two-dimensional difference coding process on the right side. The pixel value having the subscript of 0 is defined as follows.

$$P_{0,0} = P_{0,m} = 00 \ (m=1\sim M),\ P_{n,0} = P_{n-1,M} \ (n=1\sim N) \quad (2)$$

where "00" in the equation (2) indicates the values of 0 when the pixel values are expressed in hexadecimal. Given below are the brief descriptions of the meanings of the equations (1) and (2).

The equation (1) indicates that the pixel value $P_{n,m}$ after the two-dimensional difference coding process is obtained by a further difference in the secondary scanning direction in the difference between the adjacent pixels in the primary scanning direction (that is, the values enclosed by the parentheses). When the pixel value $P_{n,m}$ before the two-dimensional difference coding process is closely relevant to the pixel value of the adjacent pixel (that is, the pixel value having a similar value), the pixel value $X_{n,m}$ is close to 0.

The equation (2) indicates the definition of each pixel value when the virtual 0-th line in the secondary scanning direction and the virtual pixel value of the 0-th pixel in each line are newly provided. In the primary scanning direction, the pixel value of the leftmost pixel (pixel value $P_{n,0}$ of the 0-th pixel from left) is identified as the pixel value $P_{n-1,M}$ of the rightmost pixel in one line before the line of the above-mentioned leftmost pixel. In the secondary scanning direction, the pixel values in the top line in the drawing (the pixel value of the pixel in the 0-th line), that is, $P_{0,0}$ and $P_{0,m}$, are all fixed to 0.

In the data after the two-dimensional difference coding process, the definition of the equation (2) is applied to the pixel value of the pixel in the first line and the pixel value of the first pixel in each line because the term having the subscript of 0 occurs on the right side of the transform equation of the equation (1). Practically, by the above-mentioned equations (1) and (2), the pixel value of the pixel in the first line after the two-dimensional difference coding process is expressed as follows.

$$X_{1,1} = P_{1,1},$$

$$X_{1,2} = P_{1,2} - P_{1,1},$$

$$X_{1,3} = P_{1,3} - P_{1,2},$$

$$\ldots$$

$$X_{1,M} = P_{1,M} - P_{1,M-1}$$

On the other hand, in the data after the two-dimensional difference coding process, the pixel value of the first pixel in each line is expressed by the above-mentioned equation (2) as follows.

$$X_{1,1} = P_{1,1},$$

$$X_{2,1} = (P_{2,1} - P_{1,M}) - P_{1,1},$$

$$X_{3,1} = (P_{3,1} - P_{2,M}) - (P_{2,1} - P_{1,M})$$

$$\ldots$$

$$X_{N,1} = (P_{N,1} - P_{N-1,M}) - (P_{N-1,1} - P_{N-2,M})$$

Thus, the pixel values in the first line and the first pixel value in each line are specifically transformed, but the equation (1) is applied as it is to the pixel values other than the above-mentioned values without applying the definition of the equation (2). For example, the pixel values excluding the leftmost pixel value of the pixel values in the second line are expressed as follows.

$$X_{2,2} = (P_{2,2} - P_{2,1}) - (P_{1,2} - P_{1,1}),$$

$$X_{2,3} = (P_{2,3} - P_{2,2}) - (P_{1,3} - P_{1,2}),$$

$$\ldots$$

$$X_{2,M} = (P_{2,M} - P_{2,M-1}) - (P_{1,M} - P_{1,M-1})$$

The two-dimensional difference coding process will be described below using practical values.

Figure 8:
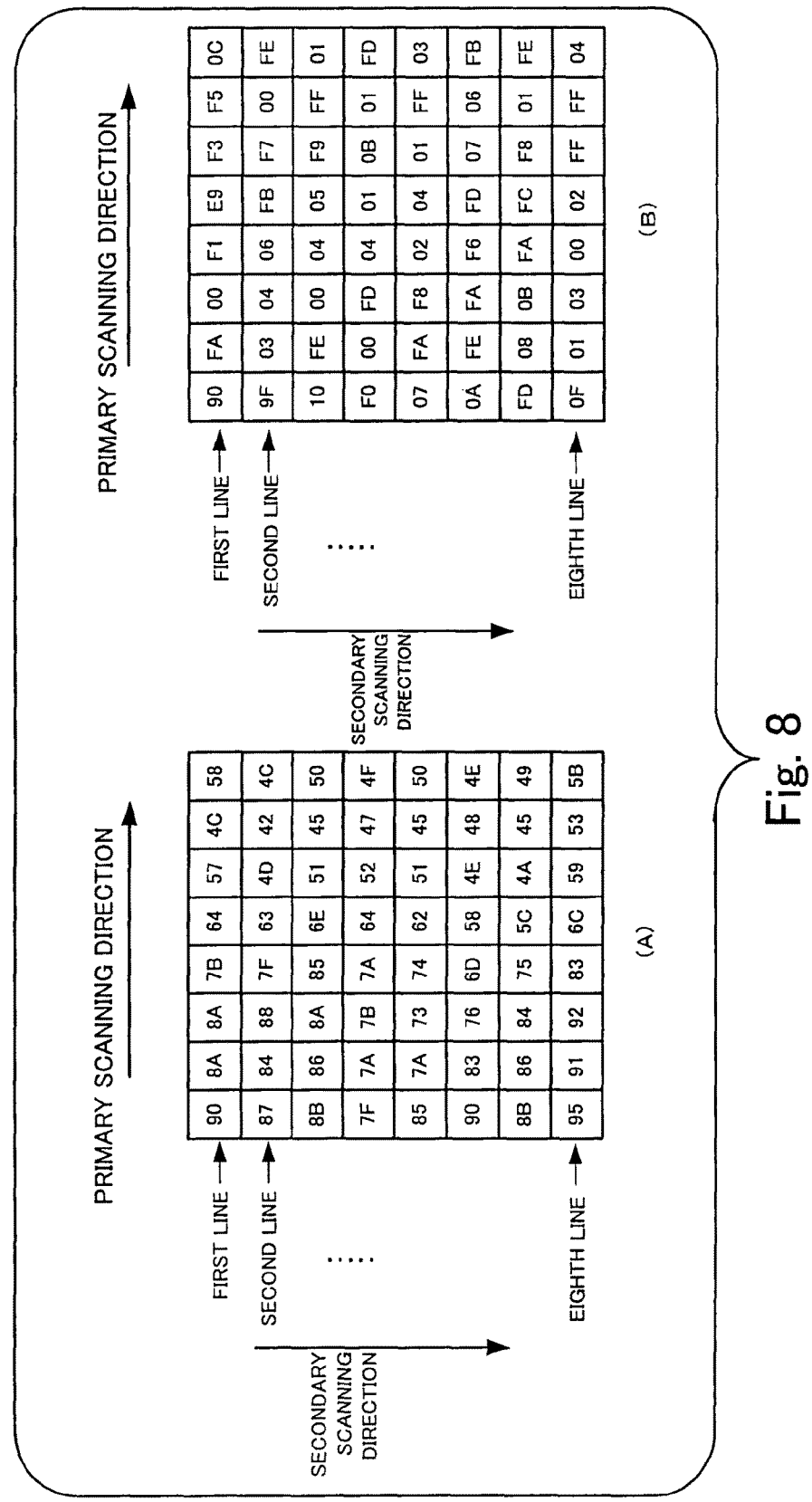
FIG. 8 exemplifies the two-dimensional difference coding process by a difference coding section forming the data compression apparatus shown in FIG. 3.

FIG. 8 exemplifies the two-dimensional difference coding process by the difference coding section 510 forming the data compression apparatus 500 shown in FIG. 3.

Each value shown on the left (Part (A)) in FIG. 8 is a pixel value forming the image data. Each value shown on the right (Part (B)) in FIG. 8 is an output value output in the two-dimensional difference coding process. The horizontal direction shown in FIG. 8 is the primary scanning direction, and the sequence of the eight values in the primary scanning direction refers to the line. The data shown in FIG. 8 indicates a total of 8 lines each of which includes eight values, which corresponds to the data where N=8, and M=8 in the data shown in FIGS. 6 and 7.

First in the two-dimensional difference coding process on the data shown in the Part (A) of FIG. 8, the leftmost "90" out of the pixel values "90 8A 8A 7B . . . " in the first line is output as $X_{1,1}$ as it is, and other values $X_{1,2}$, $X_{1,3}$, . . . are output as difference values between the adjacent values in the primary scanning direction, that is, "8A−90=FA", "8A−8A=00" and so on. The result of the subtraction of "8A"–"90" is a negative value, and expressed by a 9-bit value of "1FA", but the top value of "1" as a 1-bit value of the MSB is omitted, and only the lower order 8-bit "FA" is output.

Relating to the second line, in the equation of obtaining $X_{2,1}$, that is, $X_{2,1}=(P_{2,1}-P_{1,M})-P_{1,1}$, a value shown in Part (A) of FIG. 8 is substituted for $\{P_{2,1}, P_{1,8}, P_{1,1}\}$ on the right side when M=8, and "(87−58)−90=9F" is output as $X_{2,1}$. For other values of $X_{2,2}, X_{2,3}$, output are the further difference values "(84−87)−(8A−90)=3" "(88−84)−(8A−8A)=04" ... between the difference between the adjacent values in the primary scanning direction in the second line and the difference between the adjacent pixel values in the primary scanning direction in the first line.

Relating to the third line, in the equation of obtaining $X_{3,1}$, that is, $X_{3,1}=(P_{3,1}-P_{2,M})-(P_{2,1}-P_{1,M})$, a value shown in Part (A) of FIG. 8 is substituted for $\{P_{3,1}, P_{2,8}, P_{2,1}, P_{1,8}\}$ on the right side when M=8, and "(8B−4C)−(87−58)=10" is output as $X_{3,1}$. For other values of $X_{3,2}, X_{3,3}, \ldots$, output are the further difference values "(86−8B)−(84−87)=FE" "(8A−86)−(88−84)=00" ... between the difference between the adjacent pixel values in the primary scanning direction in the third line and the difference between the adjacent pixel values in the primary scanning direction in the second line.

In the fourth and subsequent lines, each value shown in Part (B) of FIG. 8 can be obtained by repeating the same operations as in the third line.

The interface equipment 200 shown in FIG. 1 performs the data decoding process on the data on which the two-dimensional difference coding process is performed. In the decoding process, used is the equation of obtaining $P_{n,m}$ from the value of data on which the two-dimensional difference coding process is performed. The equation is obtained as follows.

The pixel values $X_{i,j}$ after the two-dimensional difference coding process are added up from i=1 to i=m, and the values are further added up from j=1 to j=m. The sum is expressed by the following equation (3) using the equations (1) and (2).

[Formula 1]

$$\sum_{i=1}^{n}\sum_{j=1}^{m} X_{i,j} = \sum_{i=1}^{n}\left\{\sum_{j=1}^{m}(p_{i,j}-p_{i,j-1}) - \sum_{j=1}^{m}(p_{i-1,j}-p_{i-1,j-1})\right\} \quad (3)$$

$$= \sum_{i=1}^{n}\{(P_{i,m}-P_{i,0})-(P_{i-1,m}-P_{i-1,0})\}$$

$$= \sum_{i=1}^{n}\{(P_{i,m}-P_{i-1,m})-(P_{i,0}-P_{i-1,0})\}$$

$$= (P_{n,m}-P_{0,m})-(P_{n,0}-P_{0,0})$$

$$= P_{n,m}-P_{n-1,M}$$

where the equation (2) is applied to the values $\{P_{0,0}, P_{n,0}, P_{0m}\}$ occurring in the equation above. By the equation above, the pixel value $P_{n,m}$ before the two-dimensional difference coding process is expressed by the following equation (4).

[Formula 2]

$$P_{n,m} = \sum_{i=1}^{n}\sum_{j=1}^{m} X_{i,j} + P_{n-1,M} \quad (4)$$

The interface equipment 200 shown in FIG. 1 first obtains the pixel values $P_{1,1}, P_{1,2}, \ldots, P_{1,M}$ in the first line by the equation (4) above. For example, the m-th pixel value in the primary scanning direction out of the pixel values in the first line is expressed by the following equation (5) by substituting n=1 to the equation (4) above and using $P_{0,M}=0$ of the equation (2).

[Formula 3]

$$P_{1,m} = \sum_{j=1}^{m} X_{1,j} \quad (5)$$

Thus, all pixel values $P_{1,1}, P_{1,2}, \ldots, P_{1,M}$ in the first line are obtained.

The pixel values $P_{2,1}, P_{2,2}, \ldots, P_{2,M}$ in the second line can be obtained by substituting n=2 to the equation (4) above and using $P_{1,M}$ obtained by combining the pixel values in the first line. For example, the m-th pixel value in the primary scanning direction out of the pixel values in the second line is expressed by the following equation (6).

[Formula 4]

$$P_{2,m} = \sum_{j=1}^{m}(X_{1,j}+X_{2,j}) + P_{1,M} \quad (6)$$

Similarly, the pixel values in the third and subsequent lines can be obtained using the pixel values combined in the equation (6) above and the subsequent operations. The interface equipment 200 shown in FIG. 1 performs a data decoding process in this way.

The difference coding section 510 shown in FIG. 3 performs the two-dimensional difference coding process on image data. The data obtained by the two-dimensional difference coding process is input to the offset section 520 shown in FIG. 3, a predetermined offset value is added to each value of the data, and the data is divided into the lower order subplane D1L and the higher order subplane D1H. In this example, the process up to the division of the data will be specifically described below by referring to the image data of the CT data. The process up to the division of the data is performed similarly on the LW image data.

Figure 9:
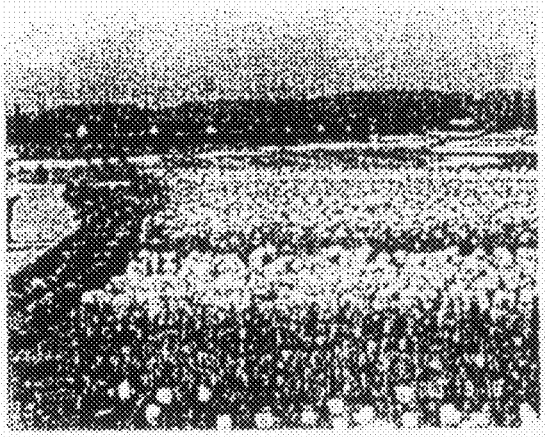
FIG. 9 shows an example of CT image data.
Figure 9:
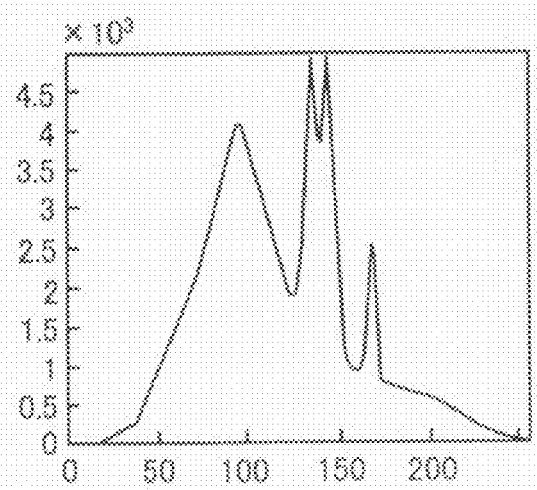

FIG. 9 shows an example of the CT image data.

Part (A) of FIG. 9 shows a monochrome landscape image as an example of a CT image represented by the CT image data. In the present embodiment of the present invention, the image data in which the density of the color of each pixel of the CT image is represented by 8-bit value is used. Part (B) of FIG. 9 shows a histogram of the data value in the image data representing the landscape image shown in Part (A), and the horizontal axis of the histogram indicates a data value, and the vertical axis indicates the number of pieces of data (number of pixels). In a CT image, the width of a histogram is generally large, and it is rare that the number of pieces of data is "0" in the histogram although there are peaks and valleys in the number of pieces of data in the histogram.

Figure 10:
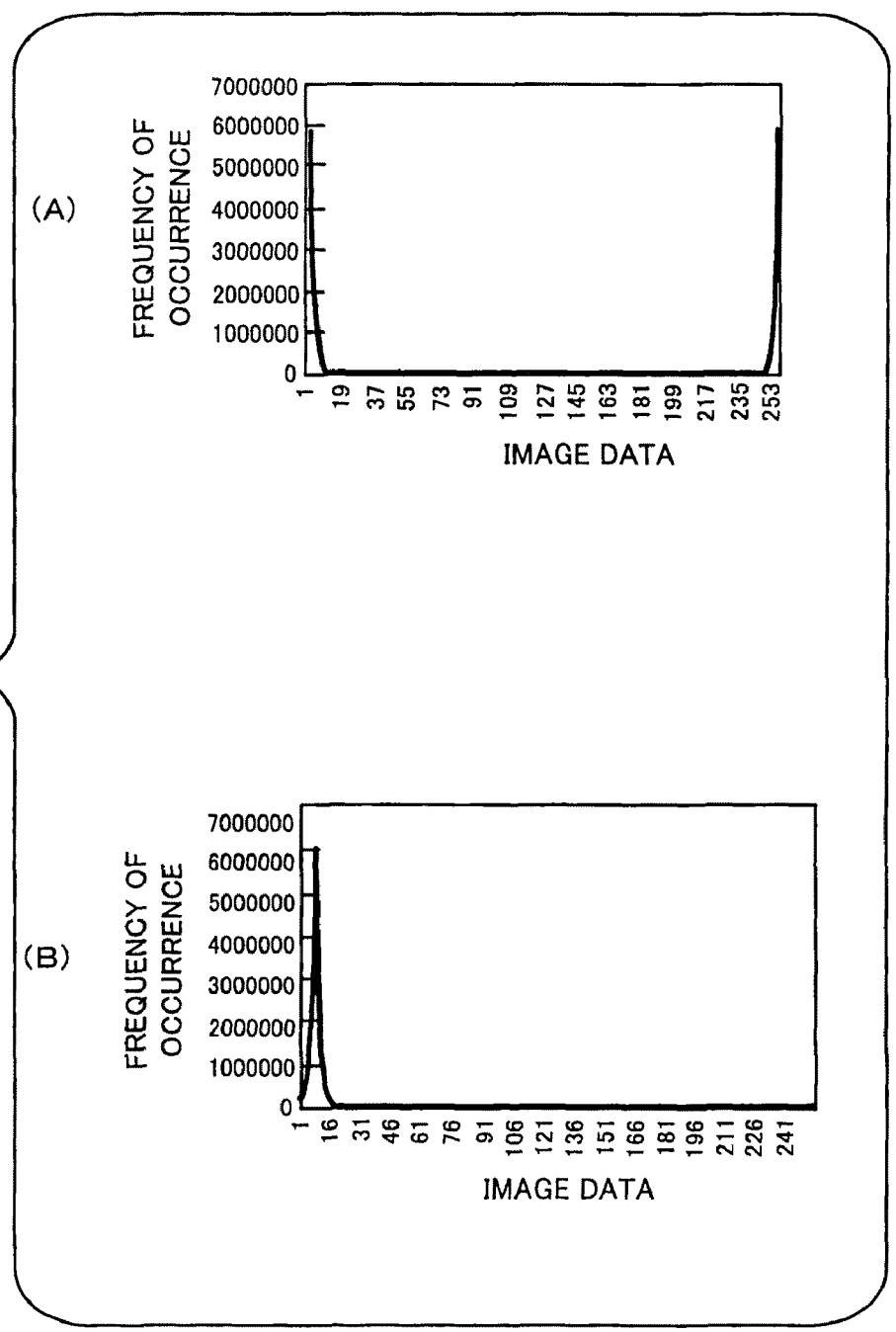
FIG. 10 shows the effect of the two-dimensional difference coding process and the offset on the CT image data.

FIG. 10 shows the effect of the difference coding and the offset on the CT image data.

Part (A) of FIG. 10 shows the histogram of the data obtained by performing the difference coding process on the CT image data shown in FIG. 9. The horizontal axis of the histogram indicates a data value, and the vertical axis indicates the frequency of occurrence. When the difference coding process shown in FIGS. 6 and 8 is performed on the CT image data, the histogram of the data generally has sharp peaks for the minimum data value and the maximum data value as shown by Part (A) of FIG. 10. When an offset is performed on the data, the histogram of the data has a sharp peak at the offset value as shown by Part (B) of FIG. 10. "8" is used as an offset value in the present embodiment of the present invention, and the frequency of the data having "16" or more as a result of an offset is almost "0".

Thus, the data having a transformed histogram by a difference coding process and an offset is divided into the lower order subplane D1L and the higher order subplane D1H by the plane division section 530 shown in FIG. 3.

Figure 11:
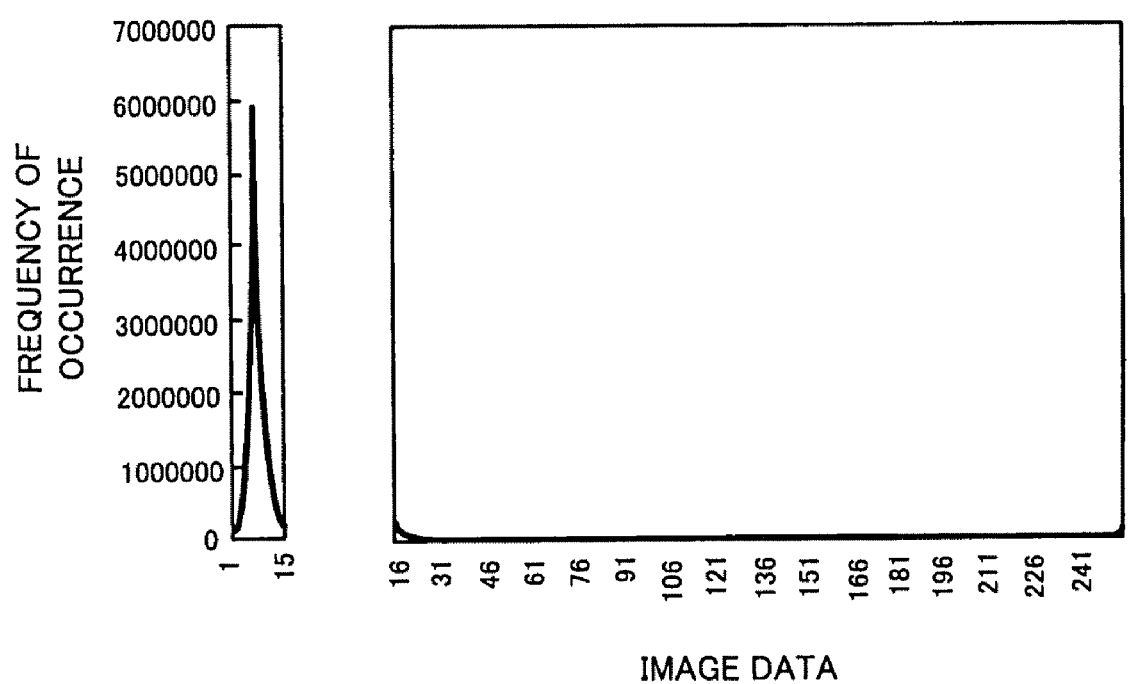
FIG. 11 is an explanatory diagram showing the effect of the data dividing process by the plane division section.

FIG. 11 is an explanatory diagram of the effect of dividing data by the plane division section 530.

FIG. 11 shows the histogram shown in Part (B) of FIG. 10 separated between the data values "15" and "16". The data division by the plane division section 530 shown in FIG. 3 generates an effect corresponding to this division of the histogram. That is, in the present embodiment of the present invention, the lower order subplane D1L formed by a sequence of values expressed by 4 lower order bits and the higher order subplane D1H formed by a sequence of values expressed by 4 higher order bits are obtained by dividing the 8-bit values forming the data. If it is interpreted that the 4-bit values forming the lower order subplane D1L represent each of the values from "0" to "15" as it is, and the 4-bit values forming the higher order subplane D1H represent 16 types of values at 16 intervals from the value "16" to the value "256", then the histogram of the lower order subplane D1L is substantially the same as the histogram shown on the left of FIG. 11, and the histogram of the higher order subplane D1H is substantially the same as the histogram shown on the right of FIG. 11. However, the histogram of the higher order subplane D1H is obtained with the peak as high as the area of the histogram shown on the left of FIG. 11 added to the data value "16" of the histogram shown on the right of FIG. 11.

Described below is the process of data after divided into the higher order subplane D1H and the lower order subplane D1L. As described above, the only difference between the process performed on the LW image data and that on the CT image data is the process of the lower order subplane D1L, and otherwise, the same process is performed on the higher order subplane D1H in either of the LW image data and the CT image data.

First, the process performed on the higher order subplane D1H will be described below.

As is known from the fact that the frequency of occurrence of the pixels is substantially zero in the histogram shown on the right of FIG. 11, it is expected that the values on the higher order subplane D1H are mostly a sequence of values close to zero ("00", "01", and "FF" in hexadecimal). Therefore, to compress the higher order subplane D1H, it is effective to perform the run length coding process of compressing data by coding a sequence of the same values, and the higher order subplane D1H is input to the run length coding section 551 that is one of the components of the H plane compression section 550 shown in FIG. 3.

In the present embodiment of the present invention, for convenience in processing, the run length coding section 551 processes a sequence of 4-bit values forming the higher order subplane D1H as 8-bit values in pairs of 4-bit values, and the following coding process is applied to a sequence of values from "00" to "FF" in hexadecimal.

In this coding process, the process is performed only on a specific value in plural 8-bit values. Therefore, the run length coding section 551 detects a value on which the coding process is to be performed (in this example, the value is referred to as a "compression object value") and a sequence of the compression object values from the received data.

In the present embodiment of the present invention, the three values of "01", "FF", and "00" are processed as compression object values as an example.

Figure 12:
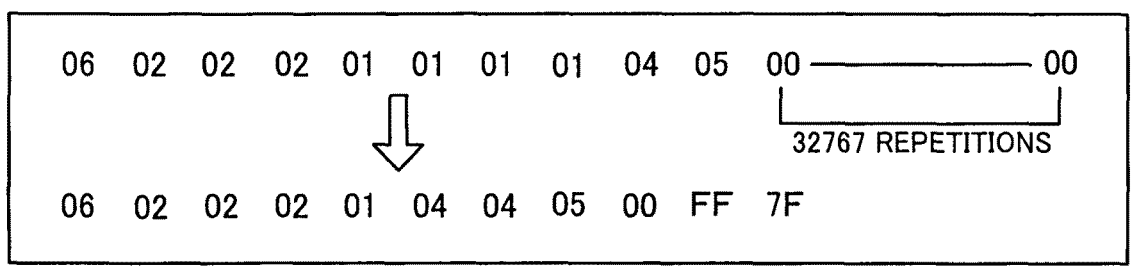
FIG. 12 is an explanatory diagram of coding process by the run length coding section shown in FIG. 3.

FIG. 12 is an explanatory diagram of coding by the run length coding section 551 shown in FIG. 3.

The upper line in FIG. 12 shows the data forming the higher order subplane D1H, and the lower line shows the data after performing the coding process by the run length coding section 551.

In this example, as indicated by the upper line shown in FIG. 12, it is assumed that the data "06 02 02 02 01 01 01 01 04 05 00 . . ." is input from the run length coding section 551. At this time, the run length coding section 551 shown in FIG. 3 detects that the leading "06" is not a compression object value, the next "02 02 02" is not a compression object value, the four compression object values "01" continue, "04" and "05" which are not compression object values are input, and then 32767 compression object values "00" continue.

Figure 13:
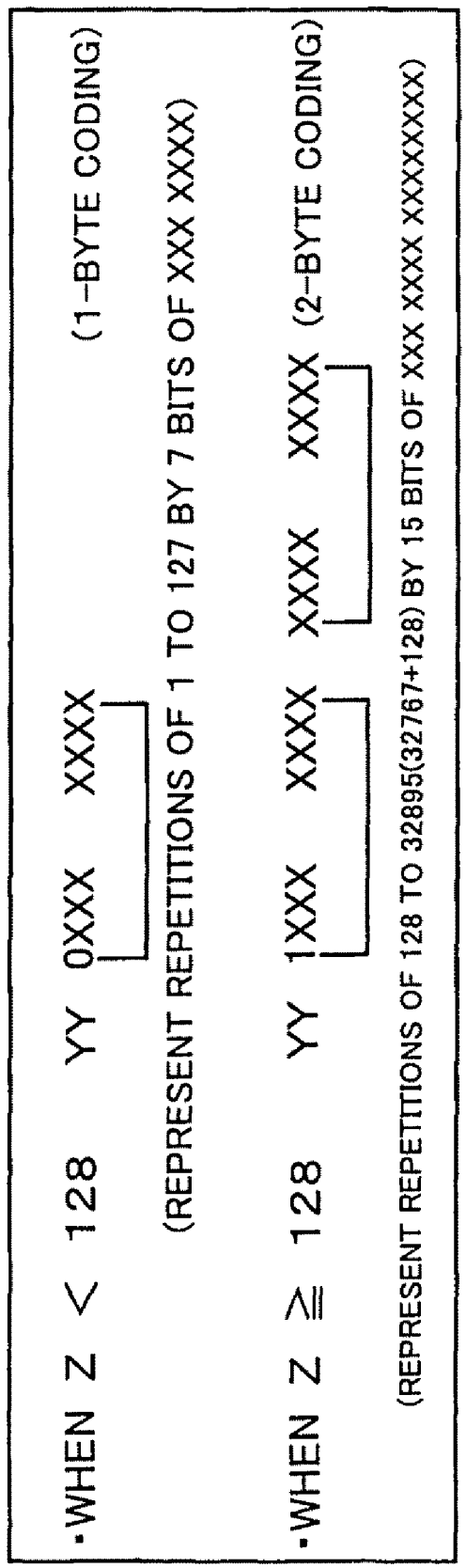
FIG. 13 shows the algorithm of coding a compression object value in the run length coding section.

FIG. 13 shows an algorithm of coding on a compression object value by the run length coding section.

In FIG. 13, Z indicates the number of repetitions of the same compression object values. For example, Z=4 for "01" in the upper line shown in FIG. 12, and Z=32767 for "00".

In FIG. 13, "YY" indicates the compression object value itself expressed by two digits in hexadecimal. "0" or "1" following the "YY" indicates "0" or "1" expressed by one bit. In the subsequent "XXX XXXX . . . ", one "X" indicates one bit, and "XXX XXXX . . . " represents the value of Z.

That is, in FIG. 13, when the compression object value "YY" continues less than Z times (Z<128), the first byte represents the compression object value "YY", the subsequent byte containing the leading bit of "0" and the subsequent 7 bits represent the value of Z. When the compression object value "YY" continues Z times or more (Z≧128), the first byte represents the compression object value "YY" and the first byte of the subsequent two bytes (16 bits) is set as "1" to indicate the representation by the continuous two bytes. The 15 subsequent bits represent the value of Z.

Based on the rule shown in FIG. 13, an example of coding shown in FIG. 12 will be described below.

Since the leading value "06" forming the data of the higher order subplane D1H (upper line) input from the plane division section 530 shown in FIG. 3 is not a compression object value, the value "06" is output as it is. The following "02 02 02" is output as it is because "02" is not a compression object value. Next, the subsequent four continuous compression object values "0 1" are coded into "01 04". The subsequent "04" and "05" are not compression object values. Therefore, "04 05" is output as it is.

Next, since "00" continues 32767 times, "00" is input, the leading one bit of the next 1 byte is set to "1", and 15 bits represent 32767-128. As a result, three bytes of "00 FF 7F" represent 32767 continuous "00". That is, the number of repetitions 128 is represented by "00 00" excluding the first bit "1".

FIG. 14 shows an example of the coding process on the basis of the number of repetitions by the run length coding section 551 shown in FIG. 3.

When "00" continues 127 times, it is coded as "00 7F" using two bytes.

When "00" continues 32767 times, it is coded as "00 FF 7E" using three bytes.

When "00" continues 32895 times, it is coded as "00 FF FF" using three bytes.

When "00" continues 128 times, it is coded as "00 80 00" using three bytes.

When "01" continues 129 times, it is coded as "00 80 01" using three bytes.

When "FF" continues 4096 times, it is coded as "FF 8F 80" using three bytes.

The run length coding section 551 shown in FIG. 3 performs the above-mentioned coding process.

The run length coding section 551 according to the present embodiment of the present invention improves the maximum compression rate up to 3/32895=1/10,965. The data of the higher order subplane D1H to be processed by the run length coding section 551 includes most of the 4-bit values of "0" representing the data value "16" as described by referring to the histogram shown in FIG. 11, and the 8-bit values generated from the 4-bit values are mostly the values "00" in hexadecimal. Therefore, considerable data compressing can be expected from the coding process by the run length coding section 551.

The data after performing the above-mentioned coding process by the run length coding section 551 shown in FIG. 3 is input to the data scanning section 552 and the Huffman coding section 553 forming the H plane compression section 550 shown in FIG. 3.

The data scanning section 552 first scans the entire data output from the run length coding section 551, and obtains the frequency of occurrence of the data value.

Figure 15:
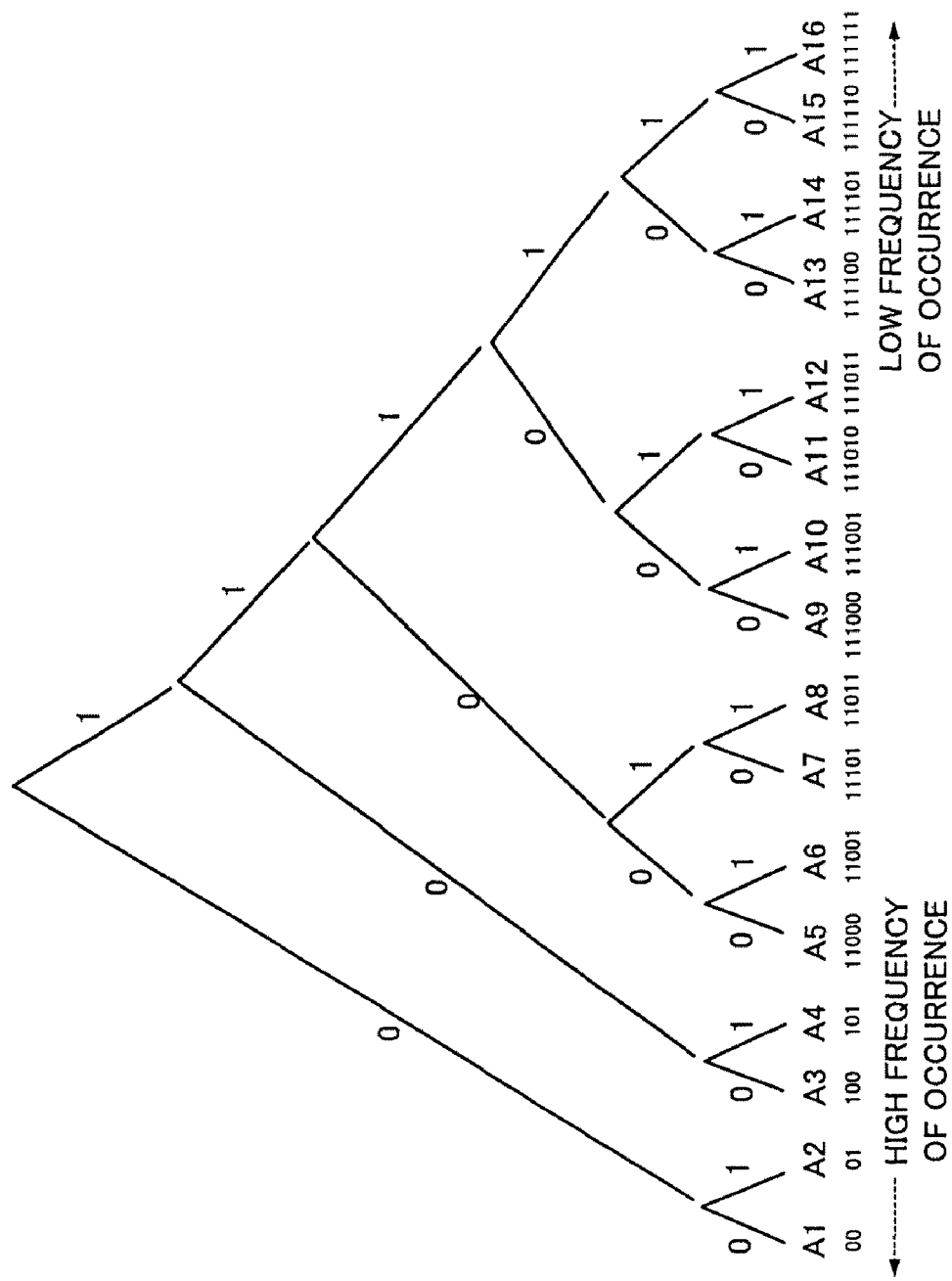
FIG. 15 shows an example of a result of a scanning process by a data scanning section.

FIG. 15 shows an example of the result of the scanning by the data scanning section 552.

In this example, assume that the frequency of occurrence of "A1" is the highest, and followed by "A2", "A3", "A4", . . . in this order. "A1", "A2", etc. do not directly represent values, but represent codes indicating values. That is, "A1" refers to the value "00", "A2" refers to the value "FF", and so on. In this description, for simplicity, each value of all the data transmitted from the run length coding section 551 shown in FIG. 3 is one of the 16 values "A1" to "A16". For each of the 16 values, the data scanning section 552 generates a Huffman table assigned a code on the basis of the frequency of occurrence. That is, "A1" having the highest frequency of occurrence is assigned the code "00" expressed by two bits. Next, "A2" is assigned the code "01" expressed by two bits. The next "A3" and "A4" are respectively assigned the codes "100" and "101" expressed by three bits, and the subsequent "A5" to "A8" are assigned each code expressed by five bits. Similarly, a value having a lower frequency of occurrence is assigned a code expressed by a larger number of bits.

FIG. 16 shows an example of a Huffman table.

The Huffman table corresponds to the one shown in FIG. 15, and is a correspondence table between a value before coding (before replacement) and a value after coding (after replacement) in which a value of a higher frequency of occurrence is replaced with a code represented by a shorter number of bits.

The Huffman coding section 553 forming the H plane compression section 550 shown in FIG. 3 codes a value of data on the basis of the Huffman table. As a result, a large number of values are replaced with codes of short number of bits, thereby realizing data compression.

Figure 17:
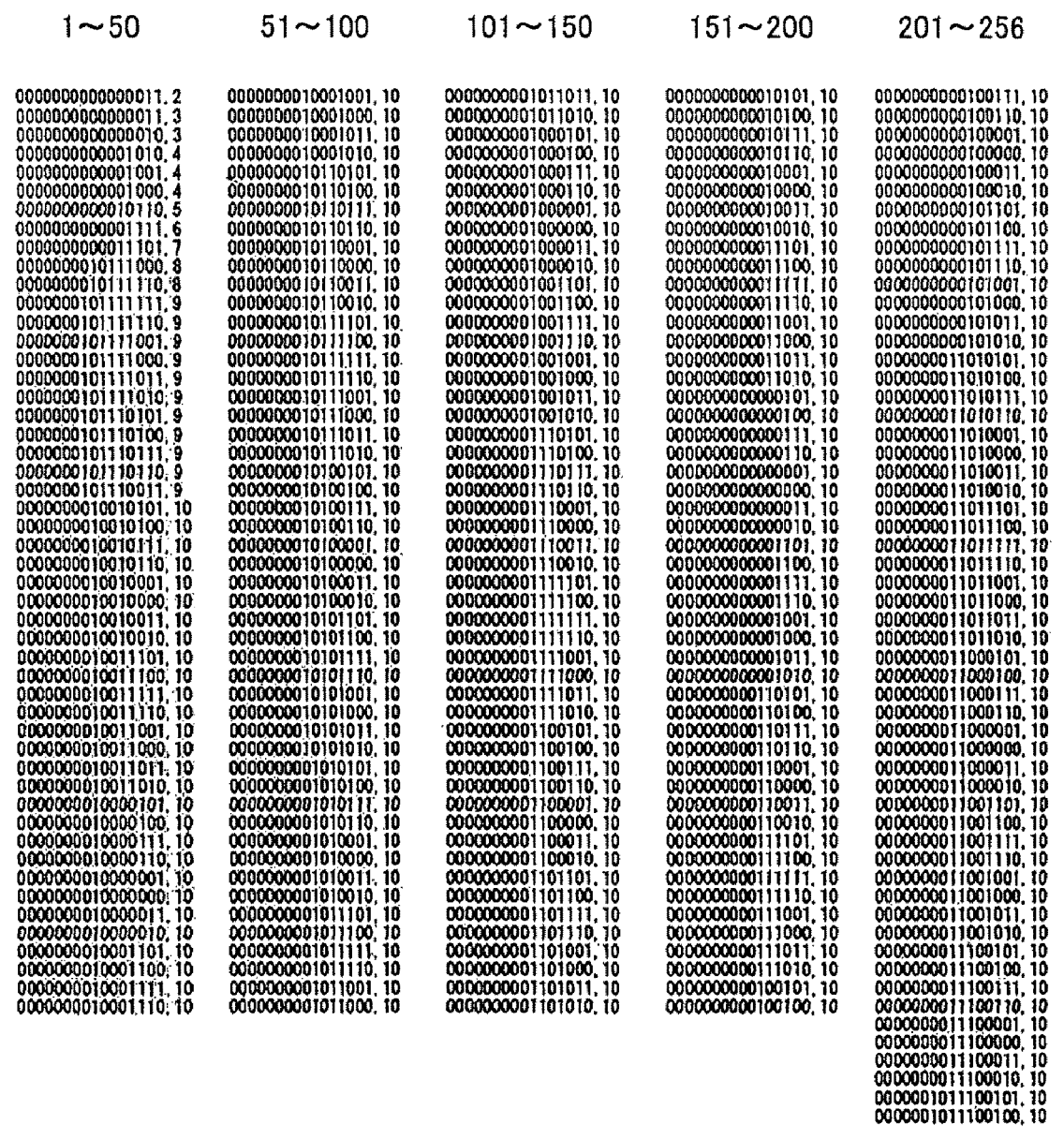

FIG. 17 shows a practical example of a code string prepared on the Huffman table.

In the code string shown in FIG. 17, the value on the right of "," in each code string indicate the bit length, and the binary code on the left of the "," of the bit length indicates the actual code. For example, the first code at the upper left shown in FIG. 17 is a 2-bit code of "11", the second code is a 3-bit code of "011", the third code is a 3-bit code of "010", and the fourth code is a 4-bit code of "1010". With this code string, a value of a higher frequency of occurrence is replaced with a code of a smaller number of bits.

In the above-described processes shown in FIGS. 12 to 17, the higher order subplane D1H input to the H plane compression section 550 shown in FIG. 3 can be compressed at a high compression rate by performing coding by the run length coding section 551 and the Huffman coding section 553 into the higher order compressed data D2H.

Described below is the process on the lower order subplane D1L. The lower order subplane D1L divided by the plane division section 530 is input to the histogram analysis section 515, and a histogram analysis is performed on the data. In this histogram analysis process, it is determined whether the data in the input image file D0 is the CT data or the LW data. In the present embodiment of the present invention, for convenience in processing, the histogram analysis section 515 processes continuous two 4-bit values configuring the lower order subplane D1L as one 8-bit value.

Figure 18:
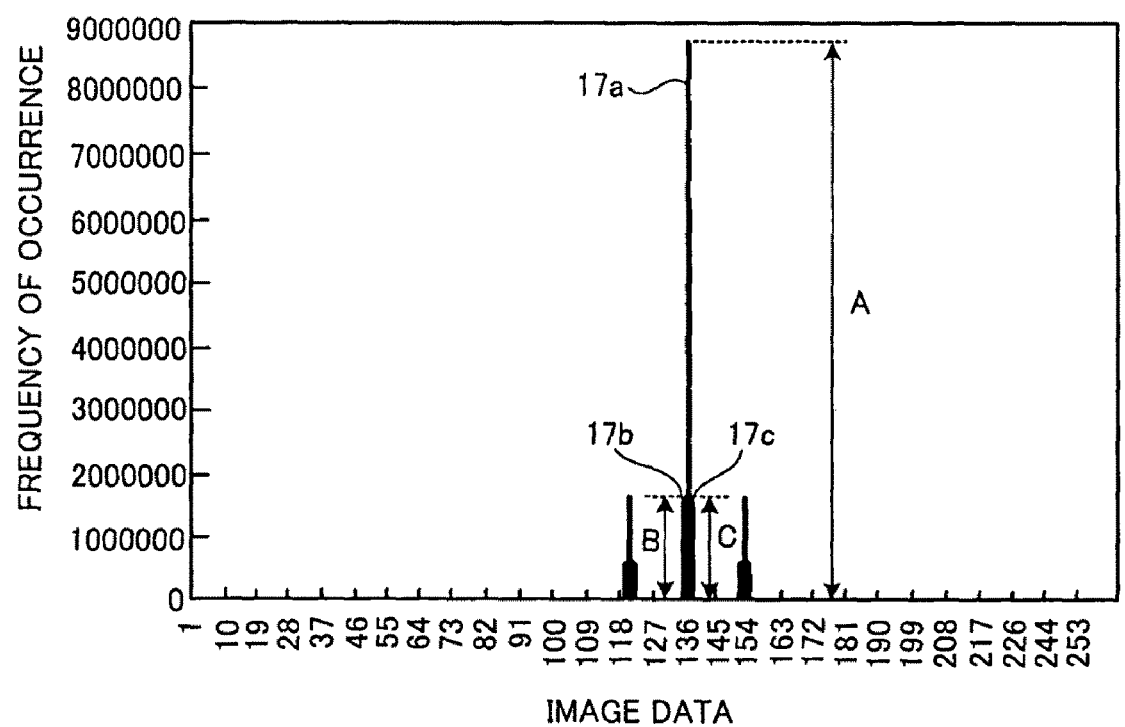
FIG. 18 shows an example of a histogram of the pixel data forming the lower order subplane as an 8-bit value.

FIG. 18 shows an example of a histogram of pixel data forming the lower order subplane D1L as an 8-bit value.

The horizontal axis of the histogram indicates the data value expressed in decimal, and the vertical axis indicates the frequency of occurrence. As shown in FIG. 18, the data values are concentrated around 136, and a first peak 17a of the highest frequency of occurrence appears at the data value of 136. The frequency of occurrence at the data value of 137 and the frequency of occurrence at the data value of 135 are also high, and form a second peak 17b and a third peak 17c respectively. In the present embodiment of the present invention, the histogram analysis section 515 determines whether the data in the input image file D0 is the CT data or the LW data in the following determining method when the height (frequency of occurrence) of the first peak 17a is A, and the heights of the second peak 17b and the third peak 17c are B and C respectively.

$(B+C) > k \times A$ . . . determined as the CT data $(B+C) \leq k \times A$ . . . determined as the LW data where k indicates a constant of approximately 0.2.

Normally the LW data after the two-dimensional difference coding process indicates higher concentration of data values than the CT data, and tends to have a high peak with a specific data value. The tendency occurs in the lower order subplane D1L after dividing data as shown in FIG. 11. After dividing the image data into the lower order subplane D1L and the higher order subplane D1H after performing the two-dimensional difference coding process, it is possible to determine whether the image data is the LW data or the CT data by evaluating the concentration of the data values on the lower order subplane D1L. There are various conventional methods of evaluating the concentration of data values, and the above-mentioned determining method by the histogram analysis section 515 is one of the methods. In this determining method, the concentration of the data values is evaluated by checking whether or not the height A of the first peak 17a is sufficiently high as compared with the heights of the adjacent peaks (B and C). By the evaluation, it is determined whether the image data is the CT data or the LW data. In this determining method, the constant k is a constant determined through an experiment (or empirically).

After the determination by the histogram analysis section 515, the lower order subplane D1L is input to the process branch section 544 in the L plane compression section 540. When the image data is the LW data, the concentration of the data values is high. Therefore, a large number of specific values (136 data values in FIG. 18) continue. As a result, to compress the lower order subplane D1L of the LW data, the run length coding process of performing compression by coding a sequence of the same values is effective. Therefore, when the histogram analysis section 515 determines that the image data is the LW data, the process branch section 544 outputs the input lower order subplane D1L to the run length coding section 545, and the run length coding section 545 performs the run length coding process described above by referring to FIGS. 12 to 14. The Huffman coding section 541 performs the Huffman coding process described above by referring to FIGS. 15 to 17 on the lower order subplane D1L after the run length coding process.

On the other hand, if the histogram analysis section 515 determines that the image data is the CT data, the process branch section 544 outputs the input lower order subplane D1L to the Huffman coding section 541, and the Huffman coding process is performed directly on the lower order subplane D1L of the CT data without performing the run length coding process.

Regardless of the LW data and the CT data, the lower order subplane D1L after the Huffman coding process is output as the lower order compressed data D2L from the L plane compression section 540.

As described above, when a user issues an instruction for a high-speed mode, the Huffman coding process by the Huffman coding section 541 is omitted regardless of the LW data or the CT data, and output from the L plane compression section 540.

This concludes the description of the present embodiment of the present invention.

In the present embodiment of the present invention, a reversible compressing process is performed on the image data of a sequence of 8-bit values. However, the present invention is not limited to the data of a sequence of 8-bit values so far as the compression object data is a sequence of values represented by values of plural bits. For example, the number of bits (bit width) of the values in the data can be 12, 16, etc. instead of 8.

What is claimed is:

1. A data compression apparatus which performs a data compressing process on data to be compressed including a sequence of values represented by a predetermined number of unit bits, comprising:
    a type determination section which determines a type of the data to be compressed;
    a difference generation section which obtains a difference between adjacent values in the sequence of the values forming the data to be compressed, and generates new data to be compressed including a sequence of values representing the difference;
    an offset section which offsets each of the values forming the new data to be compressed by a predetermined value;
    a division section which divides the values of the data to be compressed whose values are offset by the offset section into a higher order bit portion and a lower order bit portion at a predetermined number of division bits lower than the number of unit bits, thereby dividing the data to be compressed into higher order data including a sequence of higher order bit portions of the values and lower order data including a sequence of lower order bit portions of the values;
    a lower order data compression section which performs a reversible compressing process on a basis of the type determined by the type determination section on the lower order data obtained through the division by the division section; and
    a higher order data compression section which performs a reversible compressing process on the higher order data obtained through the division by the division section.

2. The data compression apparatus according to claim 1, wherein the type determination section determines the type of the data to be compressed on a basis of the lower order data obtained through the division by the division section.

3. The data compression apparatus according to claim 1, wherein the data to be compressed is data which represents one of a continuous-tone image and a line-work image, and the type determination section determines whether the data is of a first type representing the continuous-tone image or of a second type representing the line-work image.

4. The data compression apparatus according to claim 3, wherein the type determination section determines the type of the data to be compressed on the basis of a histogram of the values occurring in the data.

5. The data compression apparatus according to claim 3, wherein the type determination section determines the type of the data to be compressed on a basis of the new data to be compressed generated by the difference generation section.

6. The data compression apparatus according to claim 3, wherein the lower order data compression section comprises a type coding section which outputs values excluding one or more predetermined compression object values as they are in the lower order data and outputs a coded value representing the compression object value and a coded value representing a number of repetitions of the compression object value when the type determination section determines that the type of the data to be compressed is the second type, and outputs all values in the lower order data as they are when the type determination section determines that the type of the data to be compressed is the first type.

7. The data compression apparatus according to claim 3, wherein the lower order data compression section comprises a type coding section which outputs values excluding one or more predetermined compression object values as they are in the lower order data and outputs a coded value representing the compression object value and a coded value representing a number of repetitions of the compression object value when the type determination section determines that the type of the data to be compressed is the second type, and outputs all values in the lower order data as they are when the type determination section determines that the type of the data to be compressed is the first type; and
    an entropy coding section which performs an entropy coding process using a table for correspondence between a code and a value on data including the values output by the type coding section.

8. The data compression apparatus according to claim 7, wherein the entropy coding section receives an instruction to omit compression and outputs the data including the values output by the type coding section without compression.

9. The data compression apparatus according to claim 3, further comprising:
    a type coding section which outputs values excluding one or more predetermined compression object values as they are in the lower order data and outputs a coded value representing the compression object value and a coded value representing a number of repetitions of the compression object value when the type determination section determines that the type of the data to be compressed is the second type, and outputs all values in the lower order data as they are when the type determination section determines that the type of the data to be compressed is the first type; and a Huffman coding section which performs a Huffman coding process using a Huffman table on data including the values output by the type coding section.

10. The data compression apparatus according to claim 9, wherein the Huffman coding section receives an instruction to omit compression and outputs the data including the values output by the type coding section without compression.

11. The data compression apparatus according to claim 1, wherein the higher order data compression section comprises a first coding section which outputs values excluding one or more predetermined compression object values as they are in the higher order data and outputs a coded value representing the compression object value and a coded value representing a number of repetitions of the compression object value.

12. The data compression apparatus according to claim 1, wherein the higher order data compression section comprises:
- a first coding section which outputs values excluding one or more predetermined compression object values as they are in the higher order data and outputs a coded value representing the compression object value and a coded value representing a number of repetitions of the compression object value; and
- a second coding section which performs an entropy coding process on data coded by the first coding section using a table for correspondence between a code and a value.

13. The data compression apparatus according to claim 1, wherein the higher order data compression section comprises:
- a first coding section which outputs values excluding one or more predetermined compression object values as they are in the higher order data and outputs a coded value representing the compression object value and a coded value representing a number of repetitions of the compression object value; and
- a second coding section which performs a Huffman coding process on the data coded by the first coding section using a Huffman table.

14. The data compression apparatus according to claim 1, wherein the higher order data compression section comprises:
- a first coding section which outputs values excluding one or more predetermined compression object values as they are in the higher order data and outputs a coded value representing the compression object value and a coded value representing a number of repetitions of the compression object value;
- a histogram calculation section which obtains a histogram of the values occurring in the data coded by the first coding section;
- a code assignment section which assigns a code having a shorter length to a value with a higher frequency of occurrence in a table for correspondence between a code and a value on a basis of the histogram obtained by the histogram calculation section; and
- a second coding section which performs an entropy coding process on the data coded by the first coding section using the table in which the code is assigned by the code assignment section.

15. A data compressing program computer-readable storage medium that stores a data compressing program which is incorporated into and causes an information processing apparatus to perform a data compressing process on data to be compressed and including a sequence of values represented by a predetermined number of unit bits, the data compressing program implementing in the information processing apparatus:
- a type determination section which determines a type of the data to be compressed;
- a difference generation section which obtains a difference between adjacent values in the sequence of the values forming the data to be compressed, and generates new data to be compressed including a sequence of values representing the difference;
- an offset section which offsets each of the values forming the new data to be compressed by a predetermined value;
- a division section which divides the values of the data to be compressed whose values are offset by the offset section into a higher order bit portion and a lower order bit portion at a predetermined number of division bits lower than the number of unit bits, thereby dividing the data to be compressed into higher order data including a sequence of higher order bit portions of the values and lower order data including a sequence of lower order bit portions of the values;
- a lower order data compression section which performs a reversible compressing process on a basis of the type determined by the type determination section on the lower order data obtained through the division by the division section; and
- a higher order data compressing section which performs a reversible compressing process on the higher order data obtained through the division by the division section.

* * * * *